US009478272B1

(12) United States Patent
Grenier et al.

(10) Patent No.: US 9,478,272 B1
(45) Date of Patent: Oct. 25, 2016

(54) CONFIGURABLE STORAGE BLOCKS WITH EMBEDDED FIRST-IN FIRST-OUT AND LAST-IN FIRST-OUT CIRCUITRY

(71) Applicant: Altera Corporation, San Jose, CA (US)

(72) Inventors: Richard Arthur Grenier, San Jose, CA (US); Michael David Hutton, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/245,306

(22) Filed: Apr. 4, 2014

(51) Int. Cl.
*G11C 8/16* (2006.01)
*G11C 7/00* (2006.01)

(52) U.S. Cl.
CPC .. *G11C 8/16* (2013.01); *G11C 7/00* (2013.01)

(58) Field of Classification Search
None
See application file for complete search history.

(56) References Cited

U.S. PATENT DOCUMENTS

| | | | | |
|---|---|---|---|---|
| 4,942,553 A | * | 7/1990 | Dalrymple | G06F 13/28 710/57 |
| 5,572,148 A | * | 11/1996 | Lytle | H03K 19/17736 326/39 |
| 5,898,893 A | | 4/1999 | Alfke | |
| 6,144,220 A | | 11/2000 | Young | |
| 6,288,568 B1 | | 9/2001 | Bauer et al. | |
| 6,668,237 B1 | | 12/2003 | Guccione et al. | |
| 6,788,104 B2 | | 9/2004 | Singh et al. | |
| 7,664,928 B1 | * | 2/2010 | Andrews | G06F 9/30043 712/14 |
| 2004/0115879 A1 | * | 6/2004 | Plessier | G11C 19/287 438/202 |

* cited by examiner

*Primary Examiner* — James G Norman

(57) ABSTRACT

An integrated circuit may have configurable storage blocks. A configurable storage block may include a memory array and a control circuit. The configurable storage block may receive a mode selection command. The control circuit may determine to operate the configurable storage block in a first mode which may provide random access to the memory array or in a second mode which may provide access to the memory array in a predefined order based on the mode selection command. Thus, the configurable storage block may implement first-in first-cut modules or last-in first-out modules and variations thereof in addition to implementing memory modules with random access.

31 Claims, 8 Drawing Sheets

CONFIGURABLE STORAGE BLOCKS WITH EMBEDDED FIRST-IN FIRST-OUT AND LAST-IN FIRST-OUT CIRCUITRY

BACKGROUND

This invention relates to integrated circuits and, more particularly, to configurable storage blocks in an integrated circuit.

Considering a programmable logic device (PLD) as one example of an integrated circuit, as applications for which PLDs are used increase in complexity, it has become more common to design PLDs to include specialized blocks such as configurable storage blocks in addition to blocks of generic programmable logic.

Configurable storage blocks are often arranged in arrays of memory elements. In a typical array, data lines are used to write data into and read data from the configurable storage blocks. Address lines may be used to select which of the memory elements are being accessed. A configurable storage block is typically configurable to implement a memory of a given depth and width, whereby the maximum depth is based on the number of address lanes and the maximum width on the number of data lanes.

SUMMARY

In accordance with certain aspects of the invention, memory circuitry with input and output ports on a programmable integrated circuit and which include a storage circuit and a control circuit is presented. The control circuit may be coupled to the storage circuit and the input and output ports. The control circuit may receive a command from the input ports and select between a first and second access mode based on the command. The first access mode may provide random access to the storage circuit, and the second access mode may provide write and read operations in a predefined sequence. For example, the second access mode may include a first-in first-out (FIFO) access mode or a last-in first-out (LIFO) access mode.

It is appreciated that the present invention can be implemented in numerous ways, such as a process, an apparatus, a system, a device, or instructions executed on a programmable processor. Several inventive embodiments are described below.

In certain embodiments, the above-mentioned storage circuit may include a first multiplexer that receives a read address from the input ports and a read pointer from the control circuit and selects the read address in the first access mode and the read pointer in the second access mode. The storage circuit may further include a second multiplexer that receives a write address from the input ports and a write pointer from the control circuit and selects the write address in the first access mode and the write pointer in the second access mode. For example, In certain embodiments, the above-mentioned control circuit may include a read control circuit that receives a read enable and a read clock from the input ports and generates a read pointer that identifies a read address in the storage circuit. The control circuit may further include a write control circuit that receives a write enable and a write clock from the input ports and generates a write pointer that identifies a write address in the storage circuit.

Further features of the invention, its nature and various advantages, will be more apparent from the accompanying drawings and the following detailed description of the preferred embodiments.

DETAILED DESCRIPTION

The present invention relates to integrated circuits and more specifically to configurable storage blocks in an integrated circuit.

Conventional configurable storage blocks often support a pure memory use model in which write operations store data in a memory array at a given address and in which subsequent read operations retrieve the stored data. Typically, only a portion of a user design may perform such memory operations and this portion may vary depending on the design while some integrated circuits may provide a fixed number of configurable storage blocks. Thus, situations frequently arise where the implementation of a user design on an integrated circuit leaves some of the available configurable storage blocks unused. Consequently, it would be desirable to use these configurable storage blocks for the implementation of other design constructs.

For this purpose, a modified configurable storage block with additional circuitry (e.g., with a control block in addition to the memory array) may be provided. Such a modified configurable storage block may facilitate the efficient implementation of typical design constructs such as first-in first-out (FIFO) modules or last-in first-out (LIFO) modules. A LIFO module is sometimes also referred to as a stack.

Providing an integrated circuit with a modified configurable storage block which allows for efficient implementations of FIFO and LIFO modules has several advantages. Such a modified configurable storage block may implement any FIFO or LIFO module in a user's design and thus mitigate the need for specific logic and routing resources in the integrated circuit, thereby potentially reducing the logic resource usage and routing congestion. The implementation of a FIFO or LIFO module in a modified configurable storage block may also have deterministic timing and improved performance compared to alternative implementations of the same FIFO/LIFO module, and any engineering change order (ECO) that changes the implementation of the FIOF/LIFO such as adding or removing a stage or changing the control logic may be performed by reconfiguring the configurable storage block and thus without any impact on routing congestion or timing of the integrated circuit implementation.

It will be recognized by one skilled in the art, that the present exemplary embodiments may be practiced without some or all of these specific details. In other instances, well-known operations have not been described in detail in order not to unnecessarily obscure the present embodiments.

Figure 1:
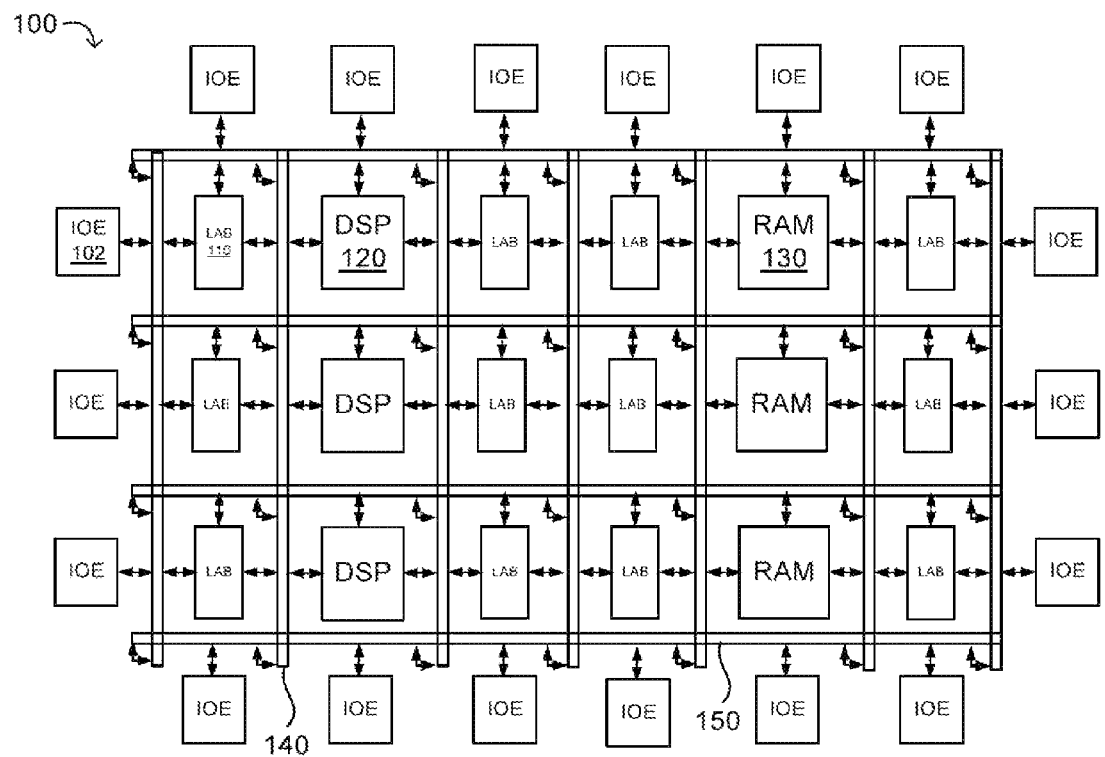
FIG. 1 is a diagram of an illustrative integrated circuit with embedded configurable storage block in accordance with an embodiment.

An illustrative embodiment of an integrated circuit such as a programmable logic device (PLD) 100 with a modified configurable storage block in accordance with the present invention is shown in FIG. 1. Programmable logic device 100 may have input/output circuitry 102 for driving signals off of PLD 100 and for receiving signals from other devices. Input/output circuitry 102 include conventional input/output circuitry, serial data transceiver circuitry, differential receiver and transmitter circuitry, or other circuitry used to connect one integrated circuit to another integrated circuit.

As shown, input/output circuitry 102 may be located around the periphery of the chip. If desired, the programmable logic device may have input/output circuitry 102 arranged in different ways. For example, input/output circuitry 102 may form one or more columns of input/output circuitry that may be located anywhere on the programmable logic device (e.g., distributed evenly across the width of the PLD). If desired, input/output circuitry 102 may form one or more rows of input/output elements (e.g., distributed across the height of the PLD). Alternatively, input/output circuitry 102 may form islands of input/output elements that may be distributed over the surface of the PLD or clustered in selected areas.

Vertical interconnection resources 140 and horizontal interconnection resources 150 such as global and local vertical and horizontal conductive lines and buses may be used to route signals on PLD 100. Vertical and horizontal interconnection resources 140 and 150 include conductive lines and programmable connections between respective conductive lines and are therefore sometimes referred to as programmable interconnects.

Programmable logic regions may include programmable components such as digital signal processing circuitry 120, storage circuitry 130, or other combinational and sequential logic circuitry organized in logic array blocks 110. The programmable logic regions may be configured to perform a custom logic function. If desired, the programmable logic region may include digital signal processing circuitry 120 and storage circuitry 130 which both may be organized in specialized blocks that have limited configurability. The programmable logic region may include additional specialized blocks such as programmable phase-locked loop circuitry, programmable delay-locked loop circuitry, or other specialized blocks with limited configurability.

Programmable logic device 100 contains programmable memory elements. These memory elements can be loaded with configuration data (sometimes also referred to as programming data) using input/output circuitry 102. Once loaded, the memory elements each provide a corresponding static control signal that controls the operation of an associated logic component in a programmable logic region. In a typical scenario, the outputs of the loaded memory elements are applied to the gates of transistors in the programmable logic region to turn certain transistors on or off and thereby configure the logic and the routing paths in the programmable logic region. Programmable logic circuit elements that may be controlled in this way include parts of multiplexers (e.g., multiplexers used for forming routing paths in programmable interconnects), look-up tables, logic arrays, AND, OR, NAND, and NOR logic gates, pass gates, etc.

Memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements are loaded with configuration data during programming, memory elements are sometimes referred to as configuration memory, configuration RAM, or programmable memory elements.

The circuitry of programmable logic device 100 may be organized using any suitable architecture. As an example, the logic of programmable logic device 100 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (i.e., resources from a pair of LEs—sometimes referred to as adaptive logic elements or ALEs in this context). The larger regions may be, for example, logic array blacks (LABs) containing multiple logic elements or multiple ALMs.

During device programming, configuration data is loaded into programmable logic device 100 that configures the programmable logic regions so that their logic resources perform desired logic functions.

Figure 2:
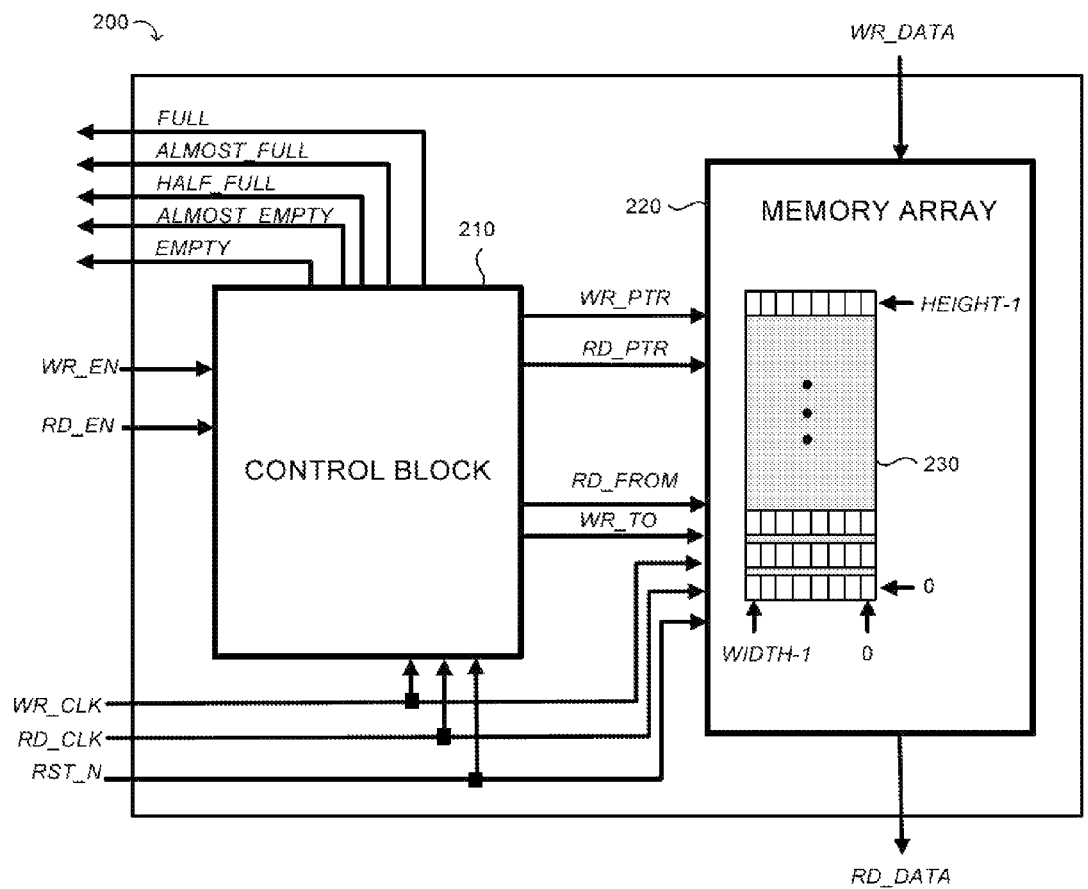
FIG. 2 is a diagram of an illustrative configurable storage block with a memory array and a control circuit in accordance with an embodiment.

At least a portion of storage circuitry 130 may be implemented as a modified configurable storage block with added functionality to implement FIFO/LIFO modules efficiently. FIG. 2 shows an embodiment of a FIFO/LIFO module implemented using a modified configurable storage block.

Configurable storage block 200 may include a control block 210, a memory array 220, and input and output ports. As shown, configurable storage block 200 may receive signals write data (WP_DATA), write clock (WR_CLK), read clock (RD_CLK), write enable (WR_EN), read enable (RD_EN), and inverted reset (RST_N) at the input ports and provide signals such as read data (RD_DATA) and status signals such as FULL, ALMOST_FULL, HALF_FULL, ALMOST_EMPTY, and EMPTY at the output ports.

Memory array 220 may be configured to operate as a register stack 230. Data may be written to the write data port (WR_DATA) and read from the read data port (RD_DATA) of memory array 220. The write operation and the read operation may be synchronized to a write clock (WR_CLK) and a read clock (RD_CLK), respectively. The write clock and read clock may be part of a common clock domain (i.e., the configurable storage block implements a single-clock FIFO (SCFIFO) or LIFO (SCLIFO)). If desired, the write clock and read clock may be part of separate clock domains (i.e., the configurable storage block implements a dual-clock FIFO (DCFIFO) or LIFO (DCLIFO). Memory array 220 may include an inbound pipeline for WR_DATA (not shown), an outbound pipeline for RD_DATA (not shown), and an optional bypass selector circuit for "fall-through" mode (not shown) in which data is written into the last free location of the FIFO and thus data is available on the RD_DATA output as soon as the same data enters the memory array on the WR_DATA input.

Memory array 220 may be configured to have HEIGHT rows and WIDTH columns to implement the register stack 230. As shown, the control block 210 may selectively access the HEIGHT rows through addresses 0 to HEIGHT-1. If desired, the control block may access the WIDTH columns through addresses 0 to WIDTH-1 instead.

Control block 210 may enable memory access to at most two independently addressable rows of the memory array at any one time, with one memory access executing a read operation and the other memory access executing a write operation. A read pointer (RD_PTR) and a write pointer (WR_PTR) may act as address counters. Control block 210 may increment the read and write pointers based on control signals "write to" (WR_TO) and "read from" (RD_FROM), respectively. A WR_PTR may point to the next available row for writing (e.g., the next available empty row), while a RD_PTR may point to the next available row for reading (e.g., the next unread row). Control block 210 may receive read enable (RD_EN) and write enable (WR_EN) which the control block may use to enable read and write operations on the register stack 230 respectively.

Control block 210 may generate status information based on the contents of the register stack 230 and provide the status information to the user. For example, the control block may generate signals FULL, ALMOST_FULL, HALF_FULL, ALMOST_EMPTY, and EMPTY. A FULL signal may indicate that the register stack 230 is in a state in which all of the addressable space in the FIFO/LIFO is used and an additional write operation may lead to an overflow of the FIFO/LIFO. As a result, control block 210 may disable any write operation for as long as the register stack 230 is full. In response to receiving a FULL signal, a user may enable an overflow protection circuit. As an example, an overflow protection circuit may apply back-pressure (i.e., sending a request to the producer of the WR_DATA to stall the production and/or the transmission of that WR_DATA). An overflow protection circuit may also discard any data that the FIFO/LIFO receives while the control circuit 210 asserts the FULL signal.

An EMPTY signal may indicate that the register stack 230 doesn't contain any data that hasn't been retrieved already and an additional read operation may lead to an underflow of the FIFO/LIFO. As a result, control block 210 may disable any read operation for as long as the register stack 230 is empty. In response to receiving an EMPTY signal, a user may enable an underflow protection circuit. As an example, an underflow protection circuit may prevent the consumer of the RD_DATA from making read requests to the FIFO/LIFO. An underflow protection circuit may also provide predetermined data that the consumer of the FIFO/LIFO data knows is invalid.

An ALMOST_FULL signal may serve as an early indicator of the FULL signal. Similarly, an ALMOST_EMPTY signal may serve as an early indicator of the EMPTY signal. A HALF_FULL signal may indicate that the FIFO/LIFO is exactly half full.

Figure 3:
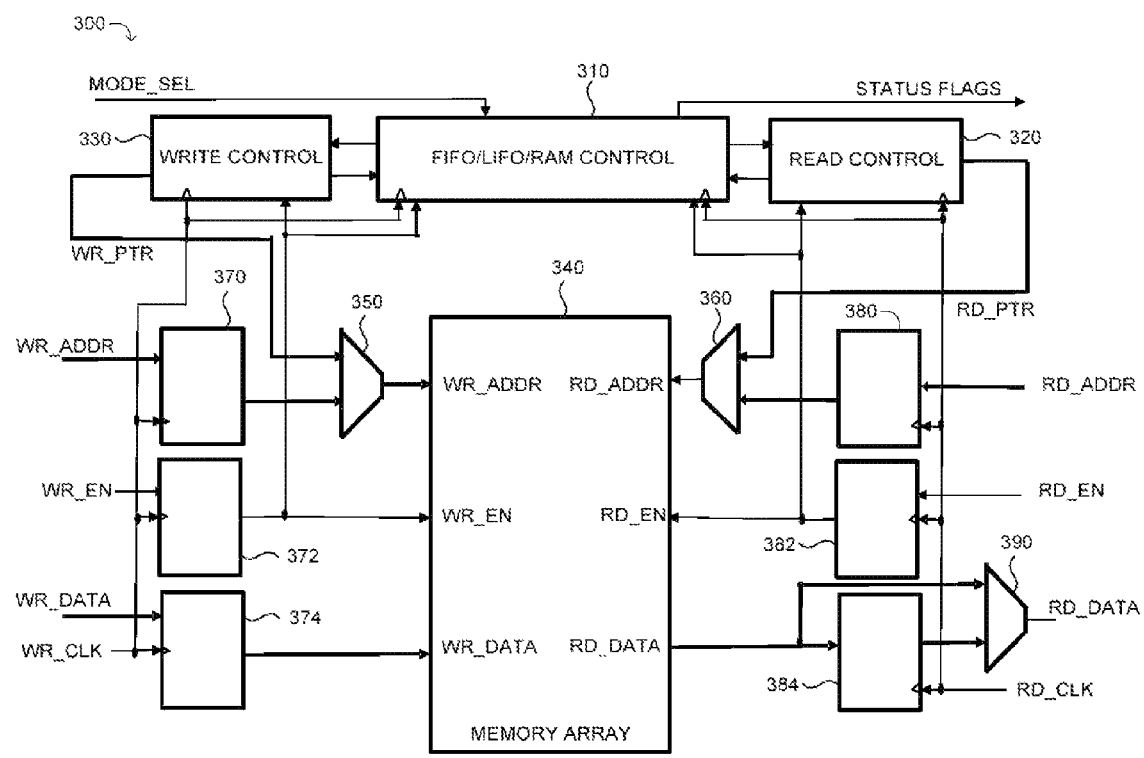
FIG. 3 is a diagram of an illustrative configurable storage block with mode selection circuitry for accessing the configurable storage block in first-in first-out (FIFO), last-in first-out (LIFO), or random-access memory (RAM) mode in accordance with an embodiment.

FIG. 3 shows an embodiment of a configurable storage block 300 which may operate as a FIFO, LIFO, or random-access memory (RAM). Configurable storage block 300 may include FIFO/LIFO/RAM control block 310, read control block 320, write control block 330, selector circuits 350 and 360, in addition to a simple dual-port storage block that includes memory array 340, registers for write address 370, write enable 372, write data 374, read address 380, read enable 382, and read data 384, and selector circuit 390 to select between data read from memory array 340 and data read from memory array 340 that has been stored in read data register 384.

For example, memory array 340, write data register 374, read data register 384, and selector circuit 390 may form memory array 220 of FIG. 2. FIFO/LIFO/RAM control block 310, read control block 320, write control block 330, selector circuits 350 and 360 may form control block 210 of FIG. 2 with read and write control blocks 320 and 330 handling the RD_FROM and WR_TO signals of FIG. 2 internally.

Configurable storage block 300 is merely illustrative and is not intended to limit the scope of the present invention. If desired, configurable storage block may include a storage block with a different port configuration such as a true dual-port storage block, a quad-port storage block, etc.

FIFO/LIFO/RAM control block 310 may receive mode selection bits (MODE_SEL). FIFO/LIFO/RAM control block 310 may configure configurable storage block 300 to access memory array 340 in FIFO mode, LIFO mode, or RAM mode based on the received mode selection bits. The RAM mode selection may further differentiate between memory array access modes based on the mode selection bits and the included storage block. For example, a configurable storage block which includes a true-dual port storage block (not shown) may be configured to operate as a single-port RAM (i.e., the read and write operations share the same address and read and write operations occur on the same port), a simple dual-port RAM (i.e., write and read operations use different ports and have dedicated addresses), a true dual-port RAM (i.e., write and read operations are available on both ports), a single-port ROM (i.e., a single-port RAM with a disabled write operation), or a dual-port ROM (i.e., a true dual-port RAM with disabled read operations on both ports).

Consider the example in which configurable storage block 300 is configured to implement a FIFO based on the mode selection bits received by FIFO/LIFO/RAM control block 310. In this example, read control block 320 and write control block 330 may implement and use memory array address counters as read pointer (RD_PTR) and write pointer (WR_PTR) respectively and direct selection circuits 350 and 360 to select read pointer and write pointer instead of the read address (RD_ADDR) and write address (WR_ADDR).

The read pointer and write pointer may increment with each write and read operation according to control bits WR_TO and RD_FROM. The read pointer may chase the write pointer in a circular (i.e., unidirectional) path, from bottom to top recursively. Both pointers may be implemented as counters of width N, where $2^N$ entries reflect the FIFO depth (i.e., the with N-bits addressable space of memory array 340), and N reflects the width (i.e., address) for each of the read and write pointers. Both write and read pointers may act separately and independently within each clock domain based on their respective WR_TO and RD_FROM sampling, with just a one-word transfer per sample per clock event (e.g., on the rising clock edge).

After RESET assertion (e.g., using RST_N of FIG. 2), both write and read pointers may point to the same segment of memory array 340 (e.g., address zero) and therefore be equal. During operation, the read pointer may catch up with the write pointer in which case both write and read pointers point to the same segment of memory array 340. Both of these cases in which the read end write pointers have the same value identify a valid EMPTY state. When the write pointer reaches the maximum number that can be formed using N-bits, the write pointer may wrap around (e.g., become zero again) and catch up with the read pointer. In this scenario, both pointers are having the same value (i.e., both pointers address the same segment of memory array 340). However, the FIFO is now FULL. Thus, a simple pointer comparison may not suffice to distinguish a FULL state from an EMPTY state.

Read control block 320 and write control block 330 may use an extra bit at the most-significant-bit (MSB) position of the write and read pointers. A write pointer (WR_PTR) or read pointer (RD_PTR) that extends beyond the maximum number that can be formed using N-bits (i.e., wraps around) may invert the respective MSB (e.g., a first wrap around may set the MSB to logic "1" and a second wrap around may set the MSB to logic "0", etc.). The MSB of the read and write pointer may then be used to distinguish a FULL state from an EMPTY state. The FIFO is FULL in the event that both MSBs are different, because the write pointer has wrapped one more time than the read pointer. However, if both MSBs are the same, then both pointers have wrapped around the same number of times and the FIFO is EMPTY.

In the example of a dual-clock FIFO, the distinction between a FULL state and an EMPTY state may depend on both read and write pointers, each of which is based on a different, independent clock domain. Thus, read and write pointer must both be synchronized to each other's clock domain to ensure that any write operation is disabled in the write clock domain when the FIFO is FULL and any read operation is disabled in the read clock domain when the FIFO is EMPTY. As both counters are multi-bit vectors, the use of Gray-code counters, which only change one bit at a time and thus requires the synchronization of a single bit at a time, is appropriate to create a version of the write pointer that is synchronous with the read clock domain, and a version of the read pointer that is synchronous with the write clock domain.

Consider the example in which configurable storage block 300 is configured to implement a LIFO based on the mode selection bits received by FIFO/LIFO/RAM control block 310. In this example, read control block 320 and write control block 330 may implement and use memory array address counters as read pointer (RD_PTR) and write pointer (WR_PTR) respectively and direct selection circuits 350 and 360 to select read pointer and write pointer instead of the read address (RD_ADDR) and write address (WR_ADDR).

Read and write pointers may be implemented as counters of width N, where $2^N$ entries reflect the LIFO depth (i.e., the with N-bits addressable space of memory array 340), and N reflects the width (i.e., address) for each of the read and write pointers. Both write and read pointers may act separately and independently within each clock domain based on their respective WR_TO and RD_FROM sampling, with just a one-word transfer per sample per clock event (e.g., on the rising clock edge). In this configuration, the LIFO is in state EMPTY when the WR_PTR is equal to zero and in state FULL when the RD_PTR is equal to N−1.

During RESET assertion (e.g., using RST_N of FIG. 2), both write and read pointers may point to the same segment of memory array 340 (e.g., address zero) and the LIFO is in state EMPTY. After reset, the read pointer and write pointer may increment with a write operation and decrement with a read operation with some exceptions. For example, the read pointer may not increment with a write operation to a LIFO that was in state EMPTY before the write operation and not decrement with a read operation from a LIFO that is in state EMPTY after the read operation. Similarly, a write pointer may not increment with a write operation to a LIFO that is in state FULL after the write operation and not decrement with a read operation from a LIFO that was in state FULL before the read operation.

A write operation may store data in the memory array at a location that corresponds to the current WR_PTR. Upon completion of the write operation, the write pointer and the read pointer may both be incremented with the exceptions described previously. A read operation may retrieve the contents of the memory array stored at the current RD_PTR value. Upon completion of the read operation, the read pointer and the write pointer may both be decremented with the exceptions previously described.

In FIFO or LIFO configuration, FIFO/LIFO/RAM control block 310 may generate status flags such as EMPTY, ALMOST_EMPTY, HALF_FULL, ALMOST_FULL, or FULL based on data received from read control block 320 and write control block 330. If desired, FIFO/LIFO/RAM control block 310 may provide additional status information. For example, FIFO/LIFO/RAM control block 310 may access the address counters for read pointer and write pointer and compute the number of available locations for read and write operations. FIFO/LIFO/RAM control block 310 may provide the number of available locations at every clock event (e.g., rising clock edge) of a provider's clock signal and a consumer's clock signal.

The providers and consumers of FIFO and LIFO data may capture the number of available locations within their own internal counters. As a result, a provider may potentially send data in a single burst until reaching the FULL limit with precision, while a consumer may potentially burst to the available EMPTY limit with precision.

In some scenarios, the implementation of a FIFO may require the use of multiple configurable memory blocks. A single-clock FIFO may operate by concatenating multiple configurable storage blocks. However, a dual-clock FIFO may have an asynchronous clock-domain crossing involved in the computation of FULL and EMPTY states and the movement of pointers, which may require the synchronization of the multiple configurable storage blocks. For this purpose, one configurable storage block may be dedicated as master, and the remaining blocks may be configured to receive the read pointer and write pointer from the master via a cascade connection.

Figure 4A:
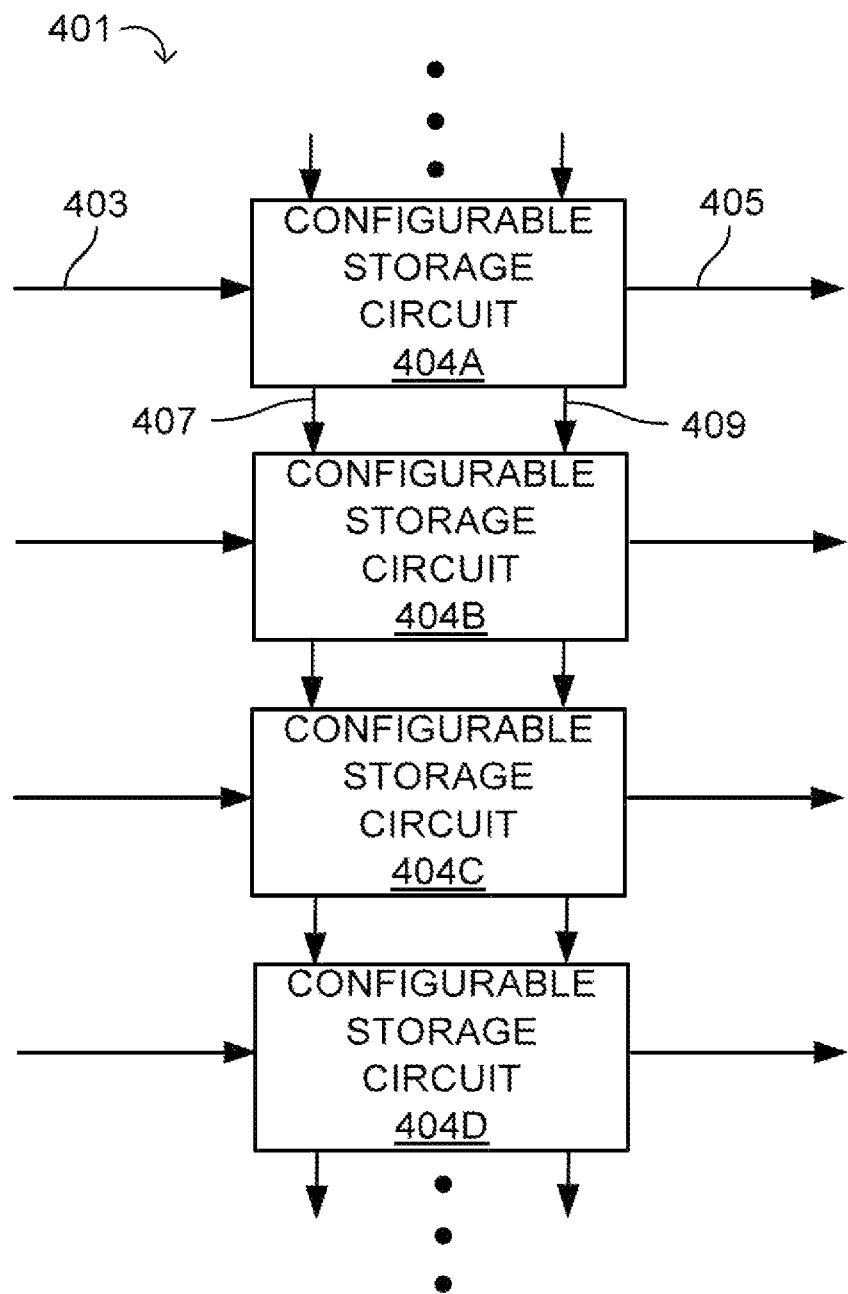
FIG. 4A is a diagram of illustrative interconnect circuitry for operating multiple configurable storage circuits in FIFO mode in accordance with an embodiment.

FIG. 4A shows an embodiment of configurable storage circuits 404A, 404B, 404C, 404D, etc. having inputs 403 and outputs 405. The configurable storage circuits may be coupled by cascade chains 407 and 409 which may enable the implementation of a FIFO using more than one configurable storage circuit. Cascade chains 407 and 409 may carry information related to read and write pointers and/or status information from one configurable storage circuit (e.g., 404A) to the next configurable storage circuit (e.g., 404B).

As shown, the information related to FIFO flows from an upper configurable storage circuit to a lower configurable storage circuit (i.e., the cascade chain passes information "down" only). In alternative embodiments, the cascade chain may pass information up, left, right, or in multiple directions based on the arrangements of the configurable storage circuits that form the FIFO. If desired, the cascade chain may connect all configurable storage circuits in a row or column on an integrated circuit. Alternatively, the cascade chain may be limited to connect configurable storage circuits within regions of the integrated circuit (e.g. groups of 4 mutually connected configurable storage circuits).

Figure 4B:
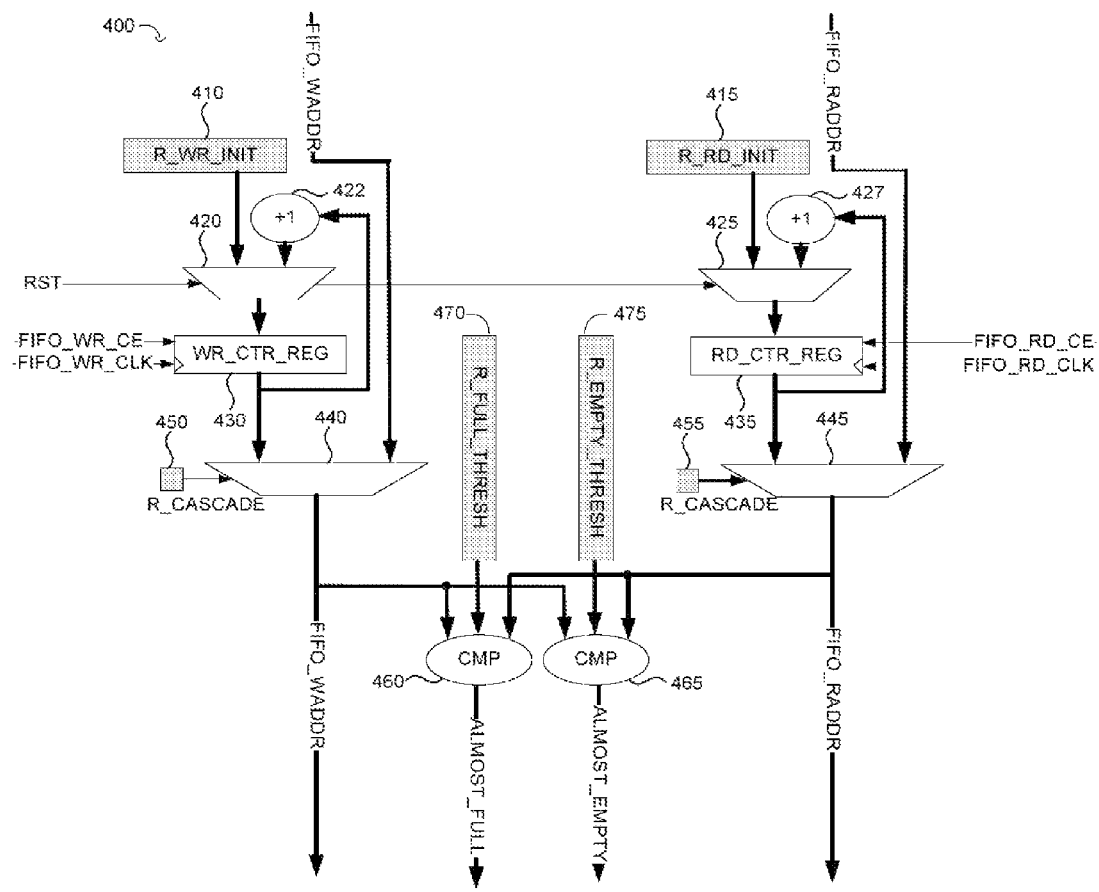
FIG. 4B is a diagram of illustrative circuitry for using multiple configurable storage blocks in FIFO mode in accordance with an embodiment.

FIG. 4B shows an embodiment of cascade chain 400, which may enable the operation of a FIFO using multiple configurable storage blocks. Cascade chain 400 may include memory elements 410, 415, 450, 455, 470, and 475, selector circuits 420, 425, 440, and 445, registers 430 and 435, increment circuits 422 and 427, and comparators 460 and 465. Memory elements 410 and 415 may store initial addresses for the write and read pointers, respectively. Memory elements 470 and 475 may store threshold values for ALMOST_FULL and ALMOST_EMPTY status, respectively.

Upon asserting reset (e.g., setting signal RST), selector circuits 420 and 425 may select the initial addresses stored in memory elements 410 and 415, and registers 430 and 435 may store the initial addresses as write and read pointers. When reset is de-asserted, selector circuits 420 and 425 may select the input from the increment circuits 422 and 427, respectively. Register 430 may store the result of the incremented write pointer after a write operation (e.g., based on signals FIFO_WR_CE and FIFO_WR_CLK). Similarly, register 435 may store the result of the incremented read pointer after a read operation (e.g., based on signals FIFO_RD_CE and FIFO_RD_CLK). Selector circuits 440 and 445 may select between the write pointer and read pointer stored in registers 430 and 435 and the write pointer and read pointer generated by a neighboring configurable storage block (e.g., FIFO_WADDR and FIFO_RADDR) based on the cascade configuration stored in memory elements 450 and 455.

Comparators 460 and 465 may each receive the write pointer and read pointer from selector circuits 440 and 445. Comparator 460 may also receive the threshold value for ALMOST_FULL from memory element 470, and generate an ALMOST_FULL status signal based on the difference between write pointer and read pointer and the received threshold value. Similarly, comparator 465 may receive the threshold value for ALMOST_EMPTY from memory element 475, and generate an ALMOST_EMPTY status signal based on the difference between write pointer and read pointer and the received threshold value.

Cascade chain 400 may include additional circuitry which is not shown in FIG. 4B. For example, additional comparators may compare the read pointer and write pointer and generate additional status information such as EMPTY, FULL, HALF_FULL, or the exact number of available locations for read or write operations.

Figure 5:
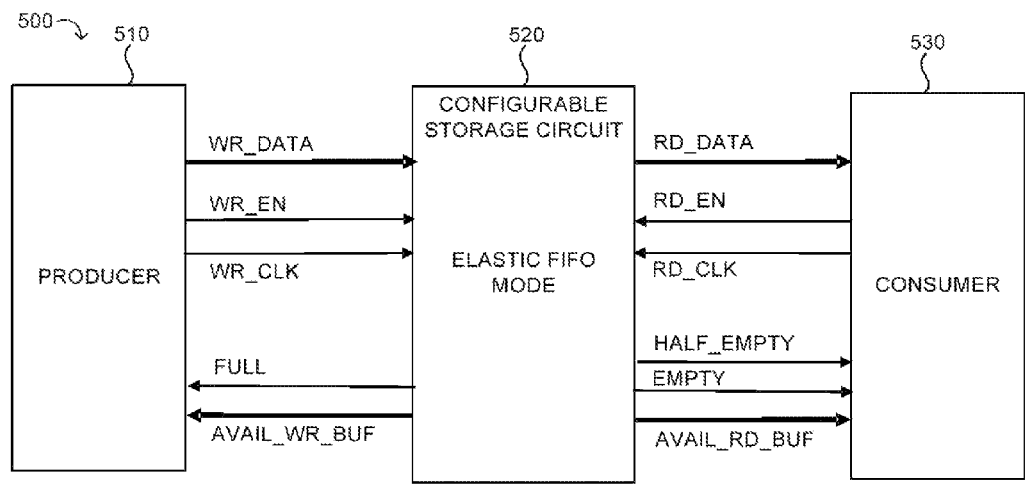
FIG. 5 is a diagram of an illustrative configurable storage block used as an elastic FIFO in accordance with an embodiment.

FIG. 5 shows an illustrative configurable storage block used as an elastic FIFO (e.g., a FIFO that interfaces between circuits that operate in different clock domains) in accordance with an embodiment. Consider the scenario of an elastic FIFO coupled between a first circuit that writes data to the elastic FIFO and a second circuit that reads data from the elastic FIFO. The first and second circuits are sometimes also referred to as producer (e.g., producer 510) and consumer (e.g., consumer 530), respectively. For example, producer 510 and consumer 530 may be programmable logic. Producer 510 may be configured to generate and provide write data to the elastic FIFO, and consumer 530 may be configured to retrieve and process read data from the elastic FIFO.

Producer 510 may operate in a first clock domain which may provide clock signal WR_CLK, while consumer 530 operates in a second clock domain which may provide clock signal RD_CLK. The first and second clock domains may be part of the same clock domain or part of different clock domains. Producer 510 may write data (WR_DATA) to configurable storage block 520 based on the write clock (WR_CLK) and the write enable (WR_EN), and consumer 530 may retrieve data from configurable storage block 520 based on the read clock (RD_CLK) and the read enable (RD_EN).

If desired, configurable storage block 520 may provide status information to producer 510 and consumer 530. For example, configurable storage block 520 may provide a FULL status signal to producer 510 for as long as the elastic FIFO is unable to receive any more data end an EMPTY status signal to consumer 530 for as long as the elastic FIFO is unable to provide data. Configurable storage block 520 may provide additional information (e.g., HALF_FULL or HALF_EMPTY) to producer 510 and consumer 530. If desired, configurable storage block 520 may access the address counters used for implementing the FIFO's read pointer and write pointer and compute the number of available locations for read and write operations. Configurable storage block 520 may provide the number of available locations at every clock event (e.g., rising clock edge) of a write clock (WR_CLK) and read clock (RD_CLK) to provider 510 and consumer 530, respectively.

Provider 510 and consumer 530 may capture the number of available locations within their own internal (burst-length) counters. As a result, provider 510 may potentially send data in a single burst until reaching the FULL limit with precision, while consumer 530 may potentially burst to the available EMPTY limit with precision.

Figure 6:
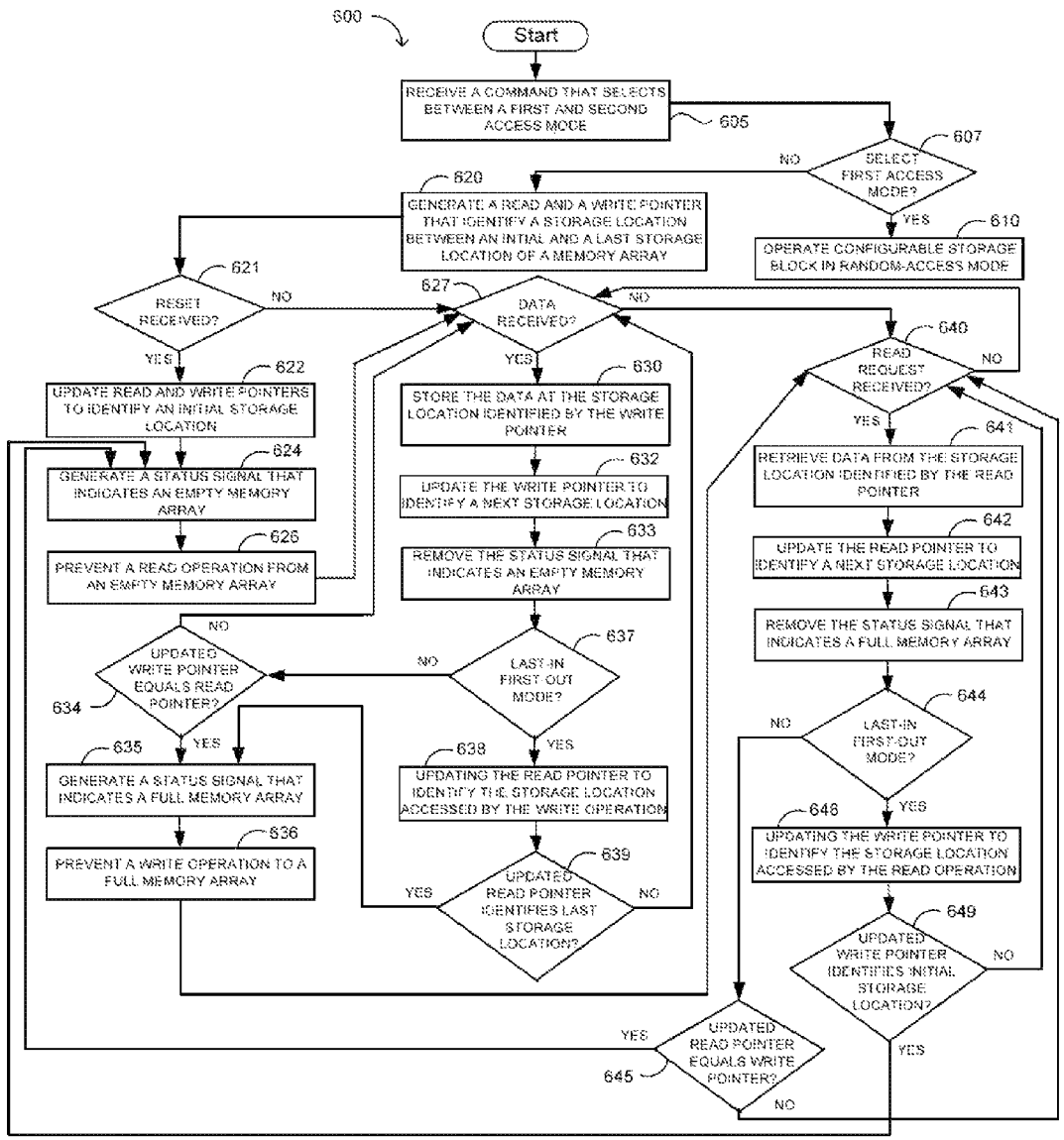
FIG. 6 is a flow chart showing illustrative steps for operating a configurable storage block in FIFO, LIFO, or RAM mode in accordance with an embodiment.

FIG. 6 is a flow chart showing illustrative steps for operating a configurable storage block in FIFO, LIFO, or RAM mode in accordance with an embodiment. The steps of FIG. 6 may, for example, be performed by control circuitry such as control circuitry 310 of FIG. 3. During step 605, the configurable storage block may receive a command that selects between a first and second access mode, whereby the first access mode provides random-access to a memory array in the configurable storage block while the second access mode performs read and write operations on the memory array in a predefined sequence. In response to determining that the command selects the first access mode during step 607, the configurable storage block may provide random-access to a memory array during step 610. In response to determining that the command does not select the first access mode, the configurable storage block may generate a read pointer and a write pointer that identify a storage location between an initial and a last storage location of a memory array during step 620.

During step 621, the configurable storage block may verify if a reset signal was received. In response to determining that a reset signal was received, the configurable storage block may update the read and write pointers to identify an initial storage location during step 622. During step 624, the configurable storage block may generate a status signal that indicates an empty memory array in the configurable storage block and prevent a read operation from the memory array for as long as no data is received.

When data is received as determined by step 627, the configurable storage block may store the data at the storage location of the memory array that is identified by the write pointer during step 630. During step 632, the configurable storage block may update the write pointer to identify a next storage location and remove the status signal that indicates an empty memory array during step 633. During step 637, the configurable storage block may verify whether the selected access mode is last-in first-out. In the event that the configurable storage block operates in LIFO mode, the configurable storage block may during step 638 update the read pointer to identify the storage location that was accessed by the write operation during step 630.

After a successful write operation, the configurable storage block may verify whether the memory array may receive additional data (i.e., whether the memory array is full). During step 639 in which the configurable storage block operates in LIFO mode, the configurable storage block may verify whether the updated read pointer identifies the last storage location. During step 634 in which the configurable storage block operates in FIFO mode, the configurable storage block may verify whether the write pointer equals to the read pointer. In response to determining that the memory array is full (e.g., during step 634 or during step 639), the configurable storage block may generate a status signal that indicates a full memory array during step 635. During step 636, the configurable storage block may prevent any write operations to the full memory array for as long as no read request is received.

When a read request is received as determined by step 640, the configurable storage block may retrieve the data from the storage location of the memory array that is identified by the read pointer during step 641. During step 642, the configurable storage block may update the read pointer to identify a next storage location and remove the status signal that indicates a full memory array during step 643. During step 644, the configurable storage block may verify whether the selected access mode is last-in first-out. In the event that the configurable storage block operates in LIFO mode, the configurable storage block may during step 648 update the write pointer to identify the storage location that was accessed by the read operation during step 641.

After a successful read operation, the configurable storage block may verify whether additional data may be retrieved from the memory array (i.e., whether the memory array is empty). During step 649 in which the configurable storage block operates in LIFO mode, the configurable storage block may verify whether the updated write pointer identifies the initial storage location. During step 645 in which the configurable storage block operates in FIFO mode, the configurable storage block may verify whether the write pointer equals to the read pointer. In response to determining that additional data may not be retrieved from the memory array (e.g., during step 634 or during step 639), the configurable storage block may generate a status signal that indicates an empty memory array during step 624.

If desired, write operation (i.e., step 630 and consecutive steps) and read operation (i.e., step 641 and consecutive steps) may be performed in parallel.

In an embodiment of the invention, a configurable storage block may provide support for the implementation of a FIFO or LIFO that performs speculative read and write operations. The configurable storage block may be configured as a speculative FIFO or LIFO using the mode selection bits of FIG. 3. When implementing a speculative FIFO, the configurable storage block may receive four additional bits, one bit to revert a write operation (WRITE-REVERT), one bit to commit a write operation (WRITE-COMMIT), one bit to revert a read operation (READ-REVERT), and one bit to commit a read operation (READ-COMMIT). When implementing a speculative LIFO, the configurable storage block may receive two additional bits, one bit to commit the read and write operations and one bit to invalidate all read and write operations since the last commit. The control bits related to the write operation (i.e., WRITE-REVERT and WRITE-COMMIT) are provided by the producer of the data, while the control bits related to the read operation (i.e., READ-REVERT and READ-COMMIT) are provided by the consumer of the data.

A speculative FIFO or LIFO may require an additional write and an additional read pointer. For example, the configurable storage block may generate a speculative read pointer and a speculative write pointer. The configurable storage block may update the speculative read and speculative write pointers during read and write operations. However, the configurable storage block may update the read and write pointers to match the speculative read and speculative write pointers only after receiving a commit and update the speculative read and speculative write pointers to match the read and write pointers after receiving a revert or invalidate signal.

Figure 7:
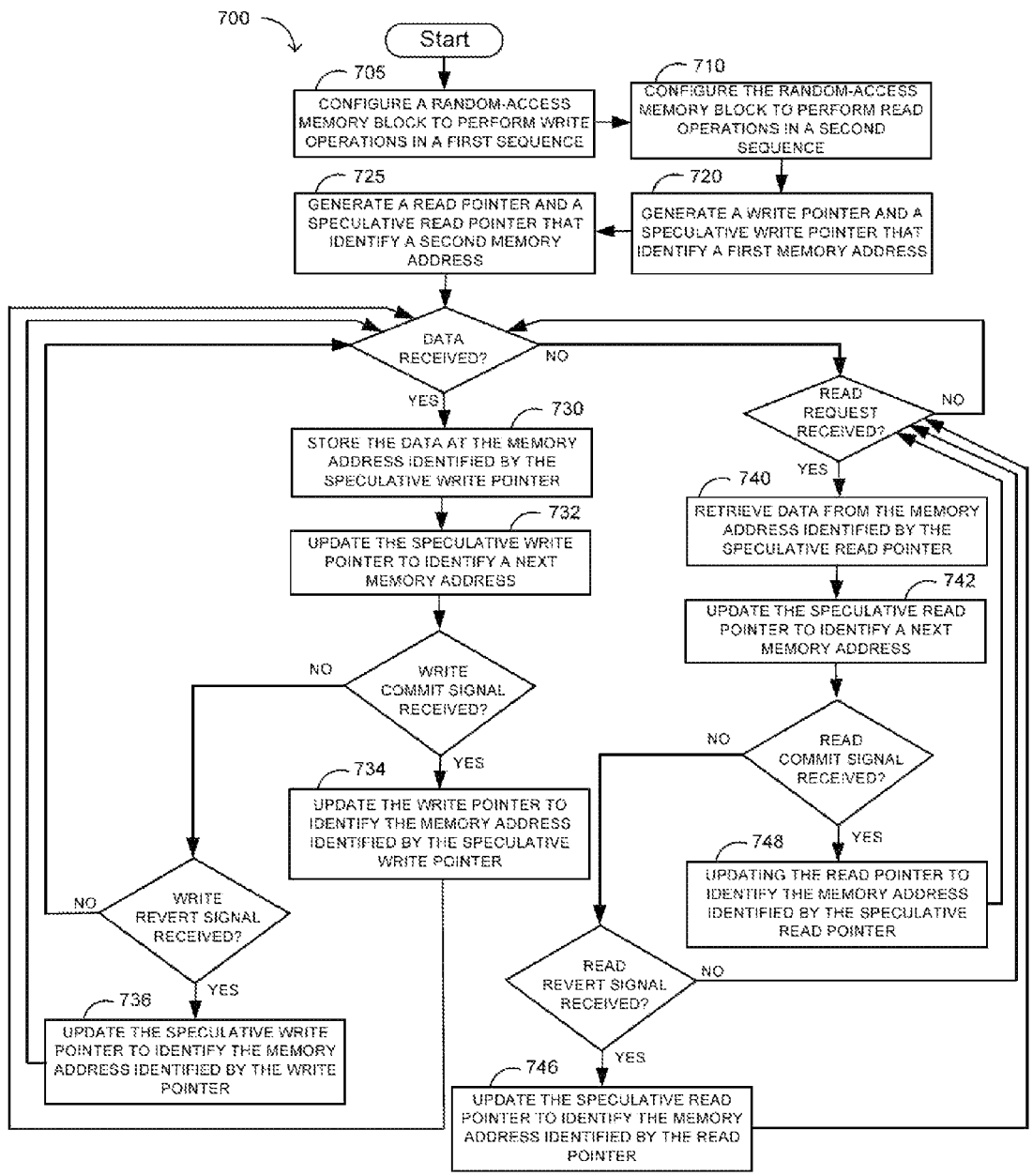
FIG. 7 is a flow chart showing illustrative steps for operating a configurable storage block in speculative FIFO or speculative LIFO mode in accordance with an embodiment.

FIG. 7 is a flow chart showing illustrative steps for operating a configurable storage block in speculative FIFO mode in accordance with an embodiment. During step 705, the configurable storage block may configure a random-access memory block to perform write operations in a first sequence. During step 710, the configurable storage block may configure the random-access memory block to perform read operations in a second sequence. For example, the configurable storage block may configure the random-access memory block to operate in FIFO mode by configuring the random-access memory block to perform read and write operations in the same sequence.

During step 720, the configurable storage block may generate a write pointer and a speculative write pointer that identify a first and second memory address. During step 725, the configurable storage block may generate a read pointer and a speculative read pointer that identify a third and fourth memory address.

Whenever data is received, the configurable storage block may store the data at the memory address identified by the speculative write pointer during step 730. During step 732, the configurable storage block may update the speculative write pointer to identify a next memory address. During step 734, in response to determining that a write commit signal is received, the configurable storage block may update the write pointer to identify the memory address identified by the speculative write pointer. During step 736, in response to determining that a write revert signal is received, the configurable storage block may update the speculative write pointer to identify the memory address identified by the write pointer. In response to determining that no write commit signal and no write revert is received or after steps 734 and 736, the configurable storage block may check if data is received.

Whenever a read request is received, the configurable storage block may retrieve the data from the memory address identified by the speculative read pointer during step 740. During step 742, the configurable storage block may update the speculative read pointer to identify a next memory address. During step 748, in response to determining that a read commit signal is received, the configurable storage block may update the read pointer to identify the memory address identified by the speculative read pointer. During step 746, in response to determining that a read revert signal is received, the configurable storage block may update the speculative read pointer to identify the memory address identified by the read pointer. In response to determining that no read commit signal and no read revert signal is received or after steps 746 and 748, the configurable storage block may check if a read request is received.

The configurable storage block may implement speculative LIFO mode by updating speculative read and write pointers after write and read operations, respectively. The speculative FIFO implementation described in FIG. 7 may provide additional features. For example, the speculative FIFO implementation may provide detailed status information about speculatively available storage locations.

The memory array of the configurable storage block described herein may be implemented using any storage technology (e.g., static random access memory (SRAM), dynamic random access memory (DRAM), flash memory, etc.). The functions implemented by the configurable storage block may apply to any memory array capacity, latency, and bandwidth, memory data-path implementation (e.g., common input/output or split input/output), number and type of configurable storage block interface ports, command/address/read-write control protocol, interface signaling method (e.g., parallel or serial), and the physical integration topology of the configurable storage block (e.g., single-die, 2.5-dimensional multiple-die, 3-dimensional stacked through-silicon-vias (3D TSV)).

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using configurable storage blocks is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by these skilled in the art without departing from the scope and spirit of the invention. The foregoing embodiments may be implemented individually or in any combination.

What is claimed is:

1. Memory circuitry on a programmable integrated circuit, the memory circuitry comprising:
   input and output ports;
   a plurality of storage circuits coupled to the input and output ports, wherein each of the storage circuits has first and second access modes, wherein the first access mode provides random access to storage locations in the storage circuits, wherein the second access mode provides access to storage locations in the storage circuits in a predetermined sequence, and wherein each of the storage circuits comprises:
      a memory array; and
      a control circuit coupled to the memory array and the input and output ports, wherein the control circuit receives a specified access mode from one of the input ports, wherein the control circuit provides access to the memory array by selecting between the first and second access modes based on the specified access mode, and wherein a cascade chain circuit is coupled between at least two storage circuits in the plurality of storage circuits.

2. The memory circuitry of claim 1, wherein the memory array receives data from the input ports, and wherein the control circuit directs the memory array to store the data at the storage locations according to the specified access mode.

3. The memory circuitry of claim 1, wherein the control circuit directs the memory array to retrieve data from the storage locations according to the specified access mode and to provide the retrieved data at the output ports.

4. The memory circuitry of claim 1, wherein each of the storage circuits further comprises:
   a first multiplexer coupled to the memory array that receives a read address from the input ports and a read pointer from the control circuit and selects the read address in the first access mode and the read pointer in the second access mode; and
   a second multiplexer coupled to the memory array that receives a write address from the input ports and a write pointer from the control circuit and selects the write address in the first access mode and the write pointer in the second access mode.

5. The memory circuitry of claim 1, wherein the second access mode comprises a first-in first-out access mode.

6. The memory circuitry of claim 1, wherein the second access mode comprises a last-in first-out access mode.

7. The memory circuitry of claim 1, wherein the control circuit further comprises:
   a read control circuit that receives a read enable and a read clock from the input ports and generates a read pointer that identifies a read address in the storage circuit; and
   a write control circuit that receives a write enable and a write clock from the input ports and generates a write pointer that identifies a write address in the storage circuit.

8. The memory circuitry of claim 7, wherein identical read and write pointers indicate a full or an empty storage circuit.

9. The memory circuitry of claim 7, wherein the cascade chain circuit comprises:
   a first multiplexer that receives the read pointer from the read control circuit and an additional read pointer from a neighboring storage circuit through the input ports and selects between the read pointer and the additional read pointer based on the command; and
   a second multiplexer that receives the write pointer from the write control circuit and an additional write pointer from a neighboring storage circuit through the input ports and selects between the write pointer and the additional write pointer based on the command.

10. The memory circuitry of claim 7, wherein the read and write pointers have an extra bit and wherein the extra bit distinguishes between a full and an empty storage circuit.

11. The memory circuitry of claim 10, wherein the control circuit prevents a read operation from an empty storage circuit and a write operation to a full storage circuit using the extra bit of the read and write pointers.

12. A method of interfacing between programmable logic and a storage circuit using a control circuit, the method comprising:

receiving a predetermined access mode with the control circuit;
with the control circuit, providing access to the storage circuit by selecting between first and second access modes based on the predetermined access mode, wherein the first access mode provides random access to storage locations in the storage circuit, and wherein the second access mode provides access to storage locations in the storage circuit in a predefined sequence;
at a first multiplexer that has an output coupled to a read address port of the storage circuit, receiving first and second read address identifiers;
at a second multiplexer that has an output coupled to a write address port of the storage circuit, receiving first and second write address identifiers; and
in the first access mode, controlling the first multiplexer to route the second read address identifier to the output of the first multiplexer while controlling the second multiplexer to route the second write address identifier to the output of the second multiplexer, wherein the second read address identifier is different from the second write address identifier.

13. The method of claim 12, further comprising:
with the control circuit, in response to selecting the second access mode, generating a write pointer signal that identifies a first storage location of the storage circuit; and
with the control circuit, generating a read pointer signal that identifies a second storage location of the storage circuit.

14. The method of claim 13, further comprising:
with the control circuit, receiving a reset signal;
with the control circuit, updating the write pointer signal to identify an initial storage location of the storage circuit; and
with the control circuit, updating the read pointer signal to identify the initial storage location of the storage circuit.

15. The method of claim 14, further comprising:
with the control circuit, in response to receiving the reset signal, generating a status signal that indicates an empty storage circuit; and
disabling read operations for as long as the status signal indicates the empty storage circuit.

16. The method of claim 12, further comprising:
with the storage circuit, receiving data;
storing the data at the first storage location of the storage circuit identified by the write pointer signal; and
with the control circuit, updating the write pointer signal to identify a third storage location of the storage circuit.

17. The method of claim 16, further comprising:
comparing the updated write pointer signal and the read pointer signal to determine whether the storage circuit is full;
with the control circuit, in response to determining that the storage circuit is full, generating a status signal that indicates a full storage circuit; and
disabling write operations for as long as the status signal indicates the full storage circuit.

18. The method of claim 16, further comprising:
with the control circuit, updating the read pointer signal to identify the first storage location of the storage circuit.

19. The method of claim 18, further comprising:
with the control circuit, generating a virtual empty signal that identifies the initial storage location of the storage circuit;
comparing the updated write pointer signal and the virtual empty signal to determine whether the storage circuit is full;
with the control circuit, in response to determining that the storage circuit is full, generating a status signal that indicates a full storage circuit; and
disabling write operations for as long as the status signal indicates the full storage circuit.

20. The method of claim 12, further comprising:
with the storage circuit receiving a read request;
retrieving data from the second storage location of the storage circuit identified by the read pointer signal; and
with the control circuit, updating the read pointer signal to identify a third storage location of the storage circuit.

21. The method of claim 20, further comprising:
comparing the updated read pointer signal and the write pointer signal to determine whether the storage circuit is empty;
with the control circuit, in response to determining that the storage circuit is empty, generating a status signal that indicates an empty storage circuit; and
disabling read operations for as long as the status signal indicates the empty storage circuit.

22. The method of claim 20, further comprising:
with the control circuit, updating the write pointer signal to identify the second storage location of the storage circuit.

23. The method of claim 22, further comprising:
with the control circuit, generating a virtual empty signal that identifies the initial storage location of the storage circuit;
comparing the updated read pointer signal and the virtual empty signal to determine whether the storage circuit is empty;
with the control circuit, in response to determining that the storage circuit is empty, generating a status signal that indicates an empty storage circuit; and
disabling read operations for as long as the status signal indicates the empty storage circuit.

24. A method for operating a random-access memory block embedded in an integrated circuit, comprising:
receiving a mode selection signal at an input of the memory block;
with a control circuit in the random-access memory block, determining based on the mode selection signal whether the random-access memory block performs sequential memory access operations for a memory array in the random-access memory block;
in response to determining that the random-access memory block performs sequential memory access operations, configuring the random-access memory block to perform write operations to a first sequence of memory locations in the memory array based on the mode selection signal by dynamically controlling a first multiplexer using the control circuit;
configuring the random-access memory block to perform read operations from a second sequence of memory locations in the memory array based on the mode selection signal by dynamically controlling a second multiplexer using the control circuit; and
using the control circuit to transmit at least one of the memory locations of the first sequence of memory locations to another control circuit in another random-access memory block.

25. The method of claim 24 further comprising:
generating a write pointer signal that identifies a first address of the random-access memory block;

generating a speculative write pointer signal that identifies the first address of the random-access memory block;

generating a read pointer signal that identifies a second address of the random-access memory block; and generating a speculative read pointer signal that identifies the second address of the random-access memory block.

26. The method of claim 25 further comprising:

receiving data at an input of the random-access memory block;

storing the data at the first address of the random-access memory block; and updating the speculative write pointer signal to identify a third address of the random-access memory block.

27. The method of claim 26 further comprising:

receiving a write revert signal at an input of the random-access memory block; and updating the speculative write pointer signal to identify the first address of the random-access memory block.

28. The method of claim 26 further comprising:

receiving a write commit signal at an input of the random-access memory block; and updating the write pointer signal to identify the third address of the random-access memory block.

29. The method of claim 25 further comprising:

receiving a read request at an input of the random-access memory block;

retrieving data at the second address of the random-access memory block; and updating the speculative read pointer signal to identify a third address of the random-access memory block.

30. The method of claim 29 further comprising:

receiving a read commit signal at an input of the random-access memory block; and updating the read pointer signal to identify the third address of the random-access memory block.

31. The method of claim 29 further comprising:

receiving a read revert signal at an input of the random-access memory block; and updating the speculative read pointer signal to identify the second address of the random-access memory block.

* * * * *